United States Patent
Gayle

Patent Number: 6,028,945
Date of Patent: Feb. 22, 2000

[54] INTERCHANGEABLE AMPLIFIER DEVICE

[76] Inventor: Charles H. Gayle, 4 Barnett St., Westville, Conn. 06511

[21] Appl. No.: 08/851,329

[22] Filed: May 5, 1997

Related U.S. Application Data

[63] Continuation-in-part of application No. 08/674,119, Jul. 1, 1996, abandoned.

[51] Int. Cl.$^7$ .................................................. H03F 21/00
[52] U.S. Cl. .............................................. 381/120; 381/28
[58] Field of Search ............................. 381/28, 120, 300, 381/303, 305, 87, 332, 335, 386, 394, 121; 330/297, 202; 455/573, 575, 99

[56] References Cited

U.S. PATENT DOCUMENTS

| | | | |
|---|---|---|---|
| 4,070,546 | 1/1978 | Hirota | 381/300 |
| 4,987,385 | 1/1991 | Engelmann | 381/120 |

*Primary Examiner*—Vivian Chang

[57] ABSTRACT

An interchangeable amplifier device includes an amplifier cabinet. The amplifier cabinet has a bottom side, a top side and enclosing side walls for housing the amplifier electronics. The enclosing side walls have a front wall and a back wall. The front wall of the cabinet has a volume control and a power switch. The back wall of the amplifier cabinet has an audio port and an AC power supply cord. The audio port has a plurality of speaker terminals and a plurality of input jacks for receiving audio input for transmission to the stereo speakers. An upgradable power board with at least four flat leads may be plugged into an upgrade slot connector found along the back wall of the amplifier cabinet. The upgradable power board receives a first voltage of input from a transformer when plugged into the upgrade slot connector. The upgradable power board, when plugged in, will resupplying the amplifier with a second voltage of a magnitude greater than the magnitude of the first voltage. Further provided is a sliding bracket assembly to which the upgrade slot connector is coupled. The sliding bracket assembly has a first orientation with the upgrade slot connector situated adjacent a plurality of openings formed in the cabinet for allowing access thereto and a second orientation with the upgrade slot connector positioned distant the openings adjacent the front wall of the cabinet for storing the upgradable power board entirely within the cabinet.

8 Claims, 8 Drawing Sheets

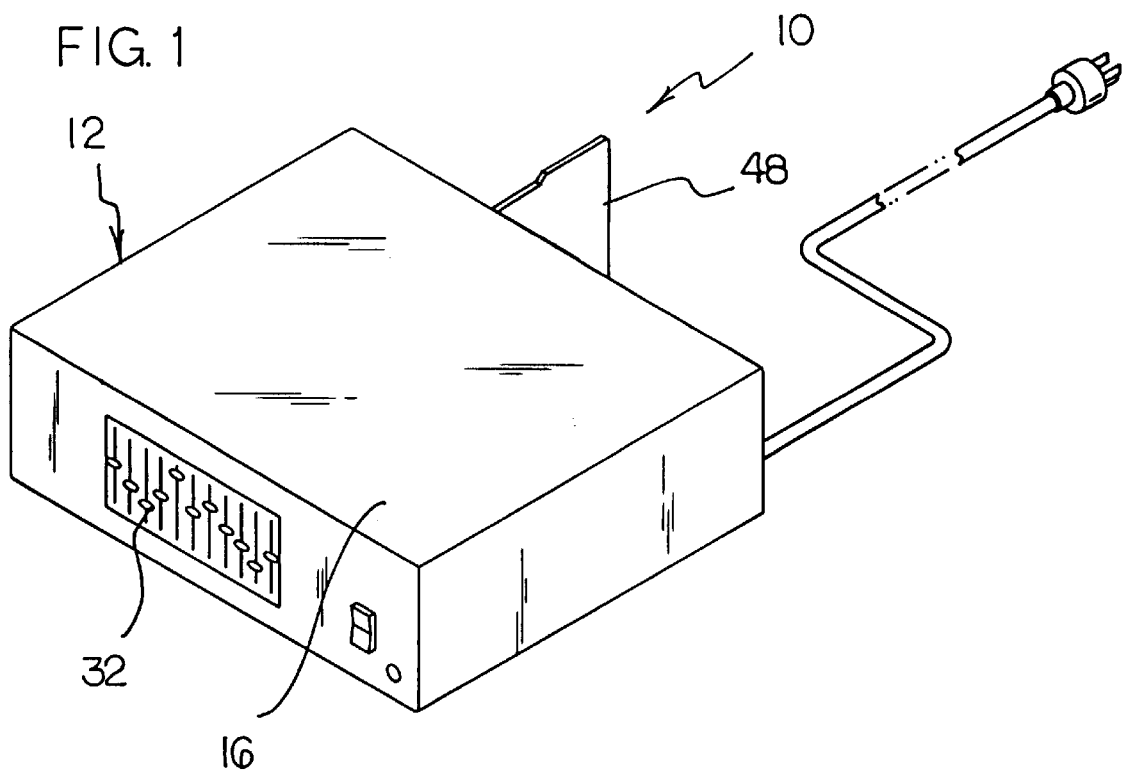
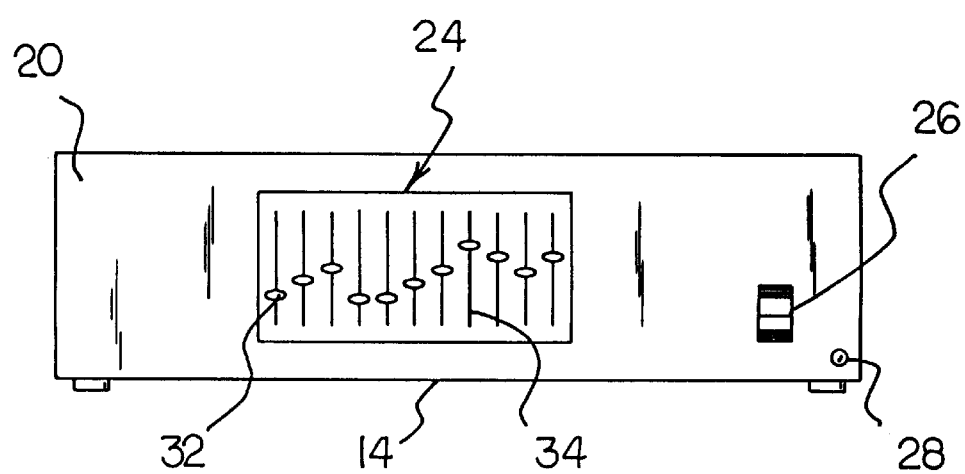

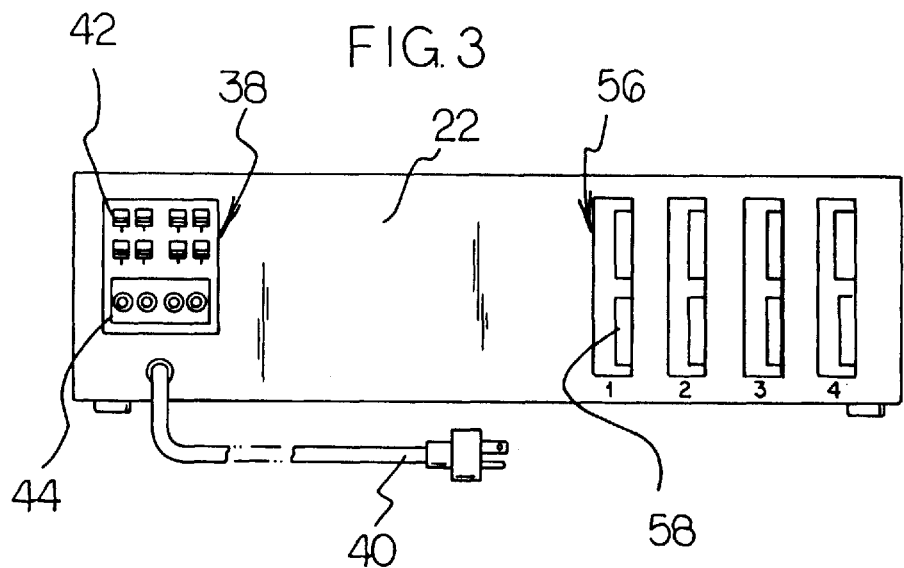
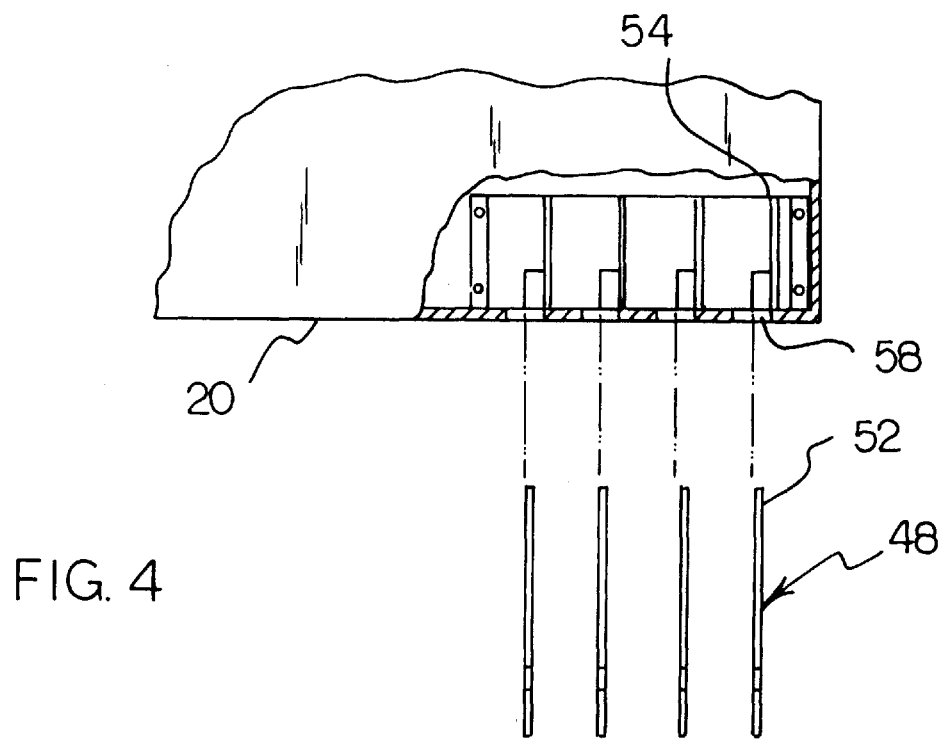

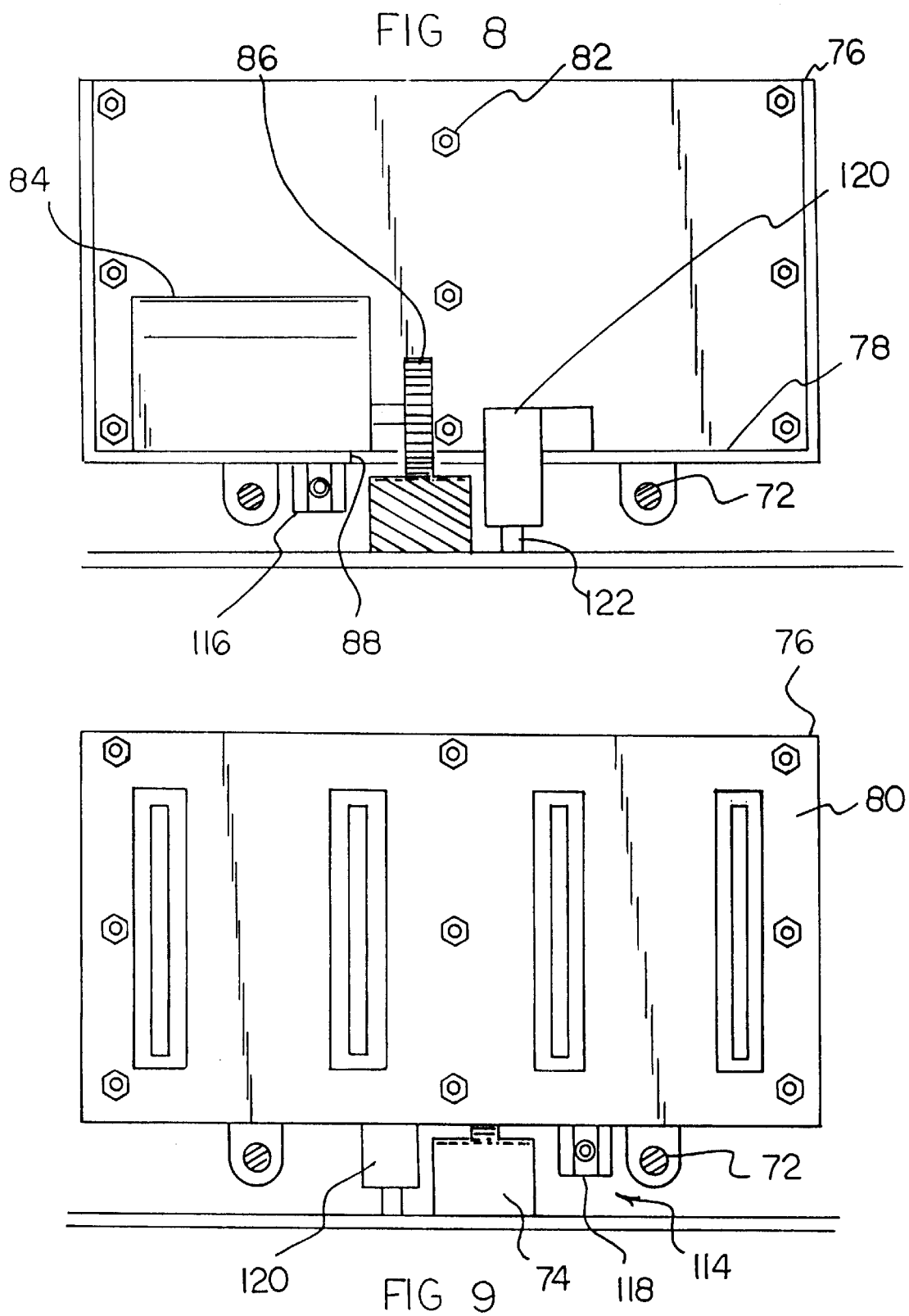

INTERCHANGEABLE AMPLIFIER DEVICE

RELATED APPLICATION

This application is a continuation-in-part of a parent application filed Jul. 1, 1996 under Ser. No. 08/674,119 now abandoned.

BACKGROUND OF THE INVENTION

1. Field of the Invention

The present invention relates to a interchangeable amplifier device and more particularly pertains to an external device for connecting to existing amplifiers to provide multilevel amplification of the frequency transmission to stereo speakers.

2. Description of the Prior Art

The use of an amplifier is known in the prior art. More specifically, amplifiers heretofore devised and utilized for the purpose of increasing the power outage to stereo speakers are known to consist basically of familiar, expected, and obvious structural configurations, notwithstanding the myriad of designs encompassed by the crowded prior art which has been developed for the fulfillment of countless objectives and requirements.

By way of example, U.S. Pat. Des. 303,800 to Newman discloses a stereo radio. U.S. Pat. No. 4,870,630 to Blake discloses a desk with removable program playing device. U.S. Pat. No. 4,636,741 to Mitzlaff discloses a multi-level power amplifying circuitry for portable radio transceivers. U.S. Pat. Des. 283,613 to Nakamura, Kido, and Ohta discloses a combined radio receiver and tape recorder. U.S. Pat. No. 4,440,987 to Keep and Schreiber discloses a computer and peripheral interface circuit. Lastly, U.S. Pat. No. 4,070,546 to Hirota discloses a portable stereo audio apparatus.

While these devices fulfill their respective, particular objectives and requirements, the aforementioned patents do not describe interchangeable amplifier device that allows the frequency output from the amplifier to the speakers to be magnified by an exterior power board that plugs into the main unit, with the power board being upgradable.

In this respect, the interchangeable amplifier device according to the present invention substantially departs from the conventional concepts and designs of the prior art, and in doing

SUMMARY OF THE INVENTION

In view of the foregoing disadvantages inherent in the known types of an amplifiers now present in the prior art, the present invention provides an improved interchangeable amplifier device. As such, the general purpose of the present invention, which will be described subsequently in greater detail, is to provide a new and improved interchangeable amplifier device and method which has all the advantages of the prior art and none of the disadvantages.

To attain this, the present invention essentially comprises a generally rectangular amplifier cabinet. The amplifier cabinet has a bottom side, a top side and enclosing side walls for housing the amplifier electronics. The enclosing side walls include a front wall and a back wall. The front wall of the cabinet has a volume control and a power switch. The volume control has a plurality of sliders, with each slider capable of moving up and down within a slider channel. The sliders control the frequencies projected through stereo speakers. The back wall of the amplifier cabinet has an audio port and an AC power supply cord. The audio port includes a plurality of speaker terminals for receiving the stereo speaker leads. The audio port also has a plurality of input jacks below the speaker terminals. The input jacks receive audio input for transmission to the stereo speakers. A generally rectangular upgradable power board is included. The upgradable power board has at least four flat leads. The four leads may be plugged into an upgrade slot connector found along the back wall of the amplifier cabinet. The upgrade slot connector includes four panels. Each panel has a plurality of vertical jack slots. The jack slots of one panel is in symmetrical alignment with the jack slots of the other panels. The upgradable power board is will receive a first voltage of input from an amplifier when plugged into the upgrade slot connector. The upgradable power board will also resupply the amplifier with a second voltage of a magnitude greater than the magnitude of the first voltage. An integrated circuit within the upgradable power board receives the first voltage of the amplifier from a transistor within the upgradable power board. The integrated circuit amplifies the first voltage to produce the second voltage for increasing the output from the amplifier to the stereo speaker.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such eguivalent constructions insofar as they do not depart from the spirit and scope of the present invention.

It is therefore an object of the present invention to provide a new and improved interchangeable amplifier device which has all the advantages of the prior art amplifiers and none of the disadvantages.

It is another object of the present invention to provide a new and improved interchangeable amplifier device which may be easily and efficiently manufactured and marketed.

It is a further object of the present invention to provide a new and improved interchangeable amplifier device which is of a durable and reliable construction.

An even further object of the present invention is to provide a new and improved interchangeable amplifier device which is susceptible of a low cost of manufacture with regard to both materials and labor, and which accordingly is then susceptible of low prices of sale to the consuming public, thereby making such interchangeable amplifier device economically available to the buying public.

Still yet another object of the present invention is to provide a new and improved interchangeable amplifier device which provides in the apparatuses and methods of the prior art some of the advantages thereof, while simultaneously overcoming some of the disadvantages normally associated therewith.

Still another object of the present invention is to connect to existing amplifiers to provide multilevel amplification of the frequency transmission to stereo speakers.

Lastly, it is an object of the present invention to provide a new and improved interchangeable amplifier device includes an amplifier cabinet. The amplifier cabinet has a bottom side, a top side and enclosing side walls for housing the amplifier electronics. The enclosing side walls have a front wall and a back wall. The front wall of the cabinet has a volume control and a power switch. The back wall of the amplifier cabinet has an audio port and an AC power supply cord. The audio port has a plurality of speaker terminals and a plurality of input jacks for receiving audio input for transmission to the stereo speakers. An upgradable power board with at least four flat leads may be plugged into an upgrade slot connector found along the back wall of the amplifier cabinet. The upgradable power board receives a first voltage of input from a transformer when plugged into the upgrade slot connector. The upgradable power board, when plugged in, will resupply the amplifier with a second voltage of a magnitude greater than the magnitude of the first voltage. Further provided is a sliding bracket assembly to which the upgrade slot connector is coupled. The sliding bracket assembly has a first orientation with the upgrade slot connector situated adjacent a plurality of openings formed in the cabinet for allowing access thereto and a second orientation with the upgrade slot connector positioned distant the openings adjacent the front wall of the cabinet for storing the upgradable power board entirely within the cabinet.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a perspective view of the preferred embodiment of the interchangeable amplifier device constructed in accordance with the principles of the present invention.

FIG. 2 is a front elevational view of the present invention of FIG. 1.

FIG. 3 is a rear elevational view of the present invention of FIG. 1.

FIG. 4 is a cut-away top view of the present invention in an operable configuration.

FIG. 8 is a rear view of the sliding bracket assembly of the embodiment shown in FIGS. 6 & 7.

FIG. 9 is a front view of the sliding bracket assembly of the alternate embodiment of the present invention.

Similar reference characters refer to similar parts throughout the several views of the drawings.

DESCRIPTION OF THE PREFERRED EMBODIMENT

Figure 5:
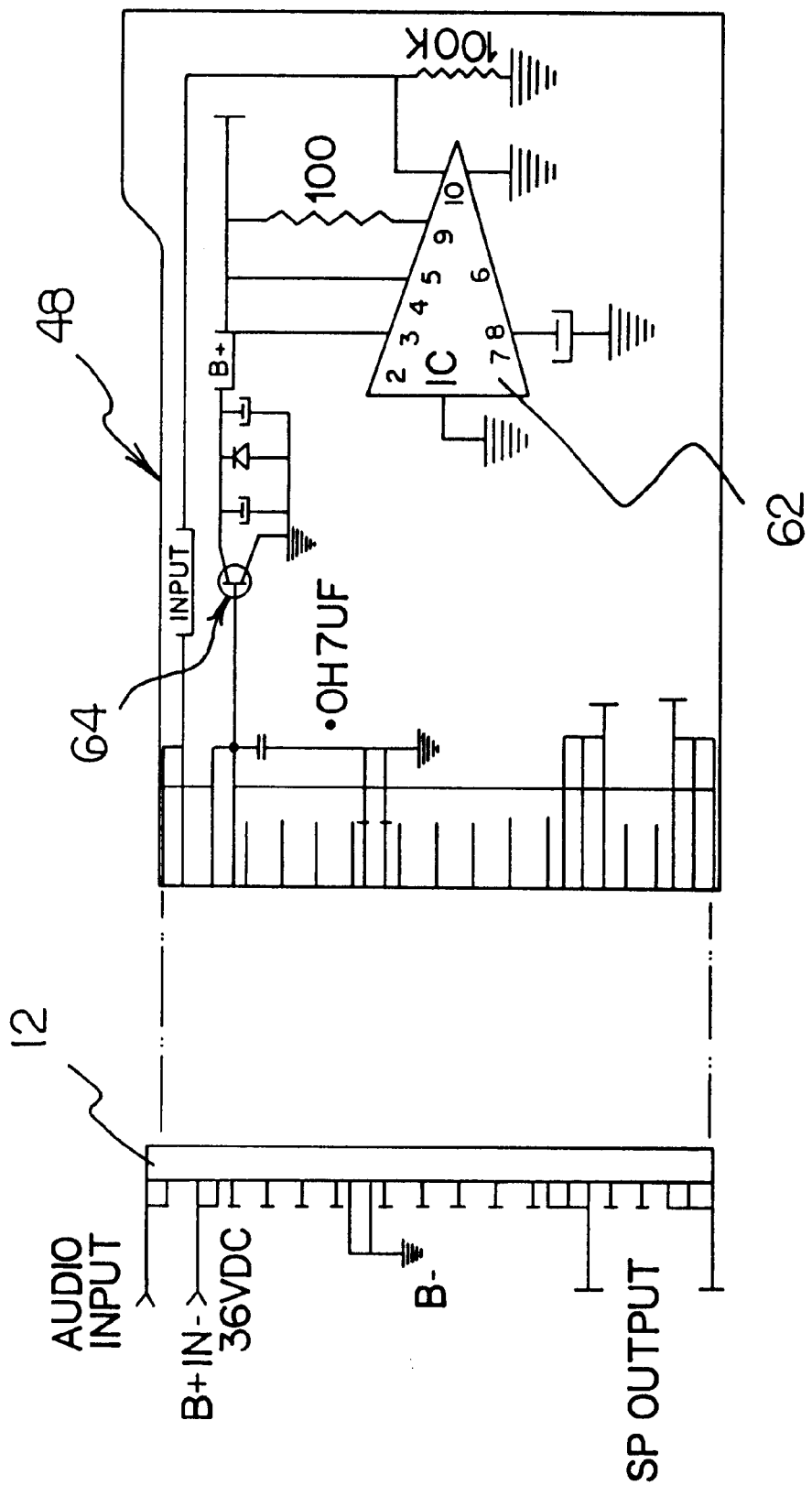
FIG. 5 is a block diagram of the interchangeable amplifier device and the rear of the amplifier of the present invention.

With reference now to the drawings, and in particular to FIG. 1 thereof, the preferred embodiment of the new and improved interchangeable amplifier device embodying the principles and concepts of the present invention and generally designated by the reference numeral 10 will be described.

The present invention, the interchangeable amplifier device 10 is comprised of a plurality of components. Such components in their broadest context include an amplifier and an upgradable power board. Such components are individually configured and correlated with respect to each other so as to attain the desired objective.

Specifically, the present invention includes a generally rectangular amplifier cabinet 12. The cabinet has a bottom side 14, a top side 16 and enclosing side walls for housing the amplifier electronics. The amplifier cabinet of FIG. 1, is formed of plastic, metal or wood. The enclosing side walls have a front wall 20 and a back wall 22. The front wall, as seen in FIG. 2, of the cabinet has a volume control 24 and a power switch 26. A LED power indicator light 28 is located near the power switch 20. When the power is turned on the light will glow. The volume control is comprised of a plurality of sliders 32. Each slider is movable up and down within a slider channel 34. The sliders control the frequency levels that are projected through stereo speakers.

As best illustrated in FIG. 3, the back wall 22 of the amplifier cabinet has an audio port 38 and an AC power supply cord 40. The audio port has a plurality of speaker terminals 42 for receiving the stereo speaker leads, that are not shown. The speaker terminal are the spring-loaded type that are currently being used by most manufactures. The audio port has a plurality of input jacks 44. The jacks are below the speaker terminals and a minimum of four jacks are required for operation. The input jacks receive audio input for transmission to the stereo speakers.

Included is an upgradable power board 48. The power board is a rigid metal, housing electrical components. As seen in FIG. 4, the board is generally rectangular. The board has two flat leads 52 and may be structured to have four flat leads. Optionally, the power board may be encased in a plastic housing for protection purposes.

The leads will be plugged into an upgrade slot connector 54 that is found along the back wall of the amplifier cabinet. The upgrade slot connector is internal the amplifier cabinet with portions of the upgrade slot connector exposed exteriorly. The exposed portions are four panels 56. The upgrade slot connector's four panels each have a plurality of vertical jack slots 58. The jack slots of one panel, as shown in FIG.

3, are symmetrically aligned with the jack slots of the other panels. The jack slots will receive the flat leads when the upgradable power board is plugged into the upgrade slot connector.

The block diagram of FIG. 5 shows the electronic schematic of the upgradable board and the rear portion of the amplifier. According to the schematic the upgradable power board is capable of receiving a first voltage of input from a transformer in the amplifier 12 when plugged into the upgrade slot connector and coupled to the amplifier. The upgradable power board is capable of resupplying the amplifier with a second voltage of a magnitude greater than the magnitude of the first voltage. The integrated circuit receives the first voltage of the amplifier from a transistor 64 that is also within the upgradable power board. The integrated circuit amplifies the first voltage to produce the second voltage for increasing the output from the amplifier to the stereo speaker.

Figure 6:
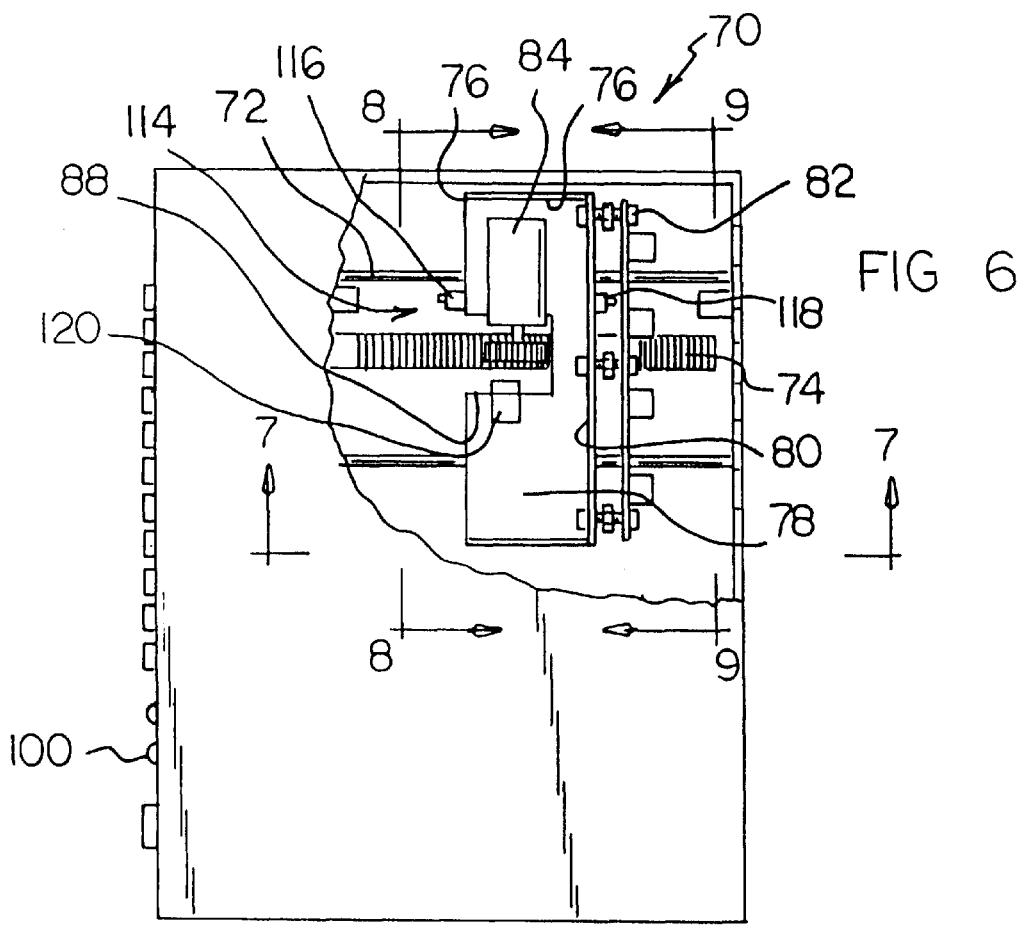
FIG. 6 is a top view of the sliding bracket assembly of an alternate embodiment of the present invention.
Figure 7:
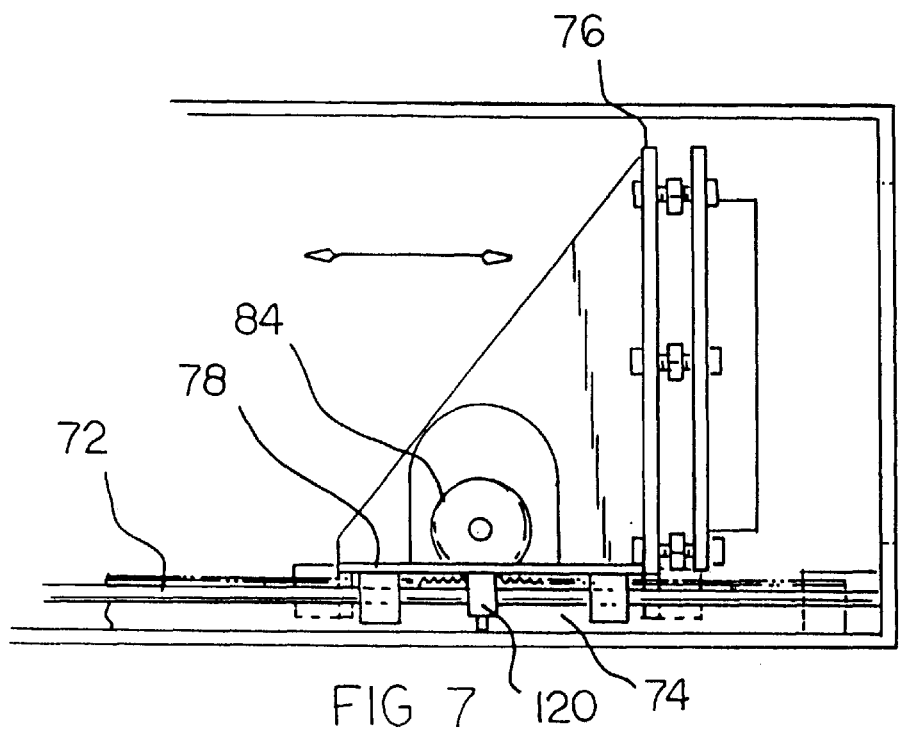
FIG. 7 is a side view of the sliding bracket assembly of the alternate embodiment of the present invention.

In an alternate embodiment as shown in FIGS. 6–11, a sliding bracket assembly 70 is provided for storing the upgradable power board within the cabinet when not in use. To accomplish this, the sliding bracket assembly includes a pair of guide rails 72 extending between the front wall and the back wall of the cabinet adjacent to the bottom side thereof. Further provided is an elongated rack 74 positioned between the guide rails in parallel relationship therewith, as shown in FIG. 6. A bracket 76 is included having an L-shaped configuration with a bottom horizontal face 78 and a top vertical face 80 integrally coupled to a side edge of the bottom horizontal face. As can be seen in FIGS. 6 & 7, the bracket is slidably coupled to the guide rails along a bottom surface of the bottom horizontal face thereof. The upgrade slot connector is coupled to an outer surface of the top vertical wall of the bracket via a plurality of nuts and bolts 82. Note FIGS. 6–9. By this structure, the sliding bracket assembly has a first orientation with the upgrade slot connector situated adjacent a plurality of openings formed in the cabinet for allowing access thereto. For storing the upgradable power board entirely within the cabinet, the sliding bracket assembly has a second orientation with the upgrade slot connector positioned distant the openings adjacent the front wall of the cabinet. See FIG. 11. The sliding bracket assembly further includes a pinion motor 84 positioned on a top surface of the bottom horizontal face of the bracket with a pinion 86 thereof extending through a cutout 88 formed in the bottom horizontal face for engaging the rack thereby facilitating mechanized sliding of the sliding assembly along the guide rails.

Figure 10:
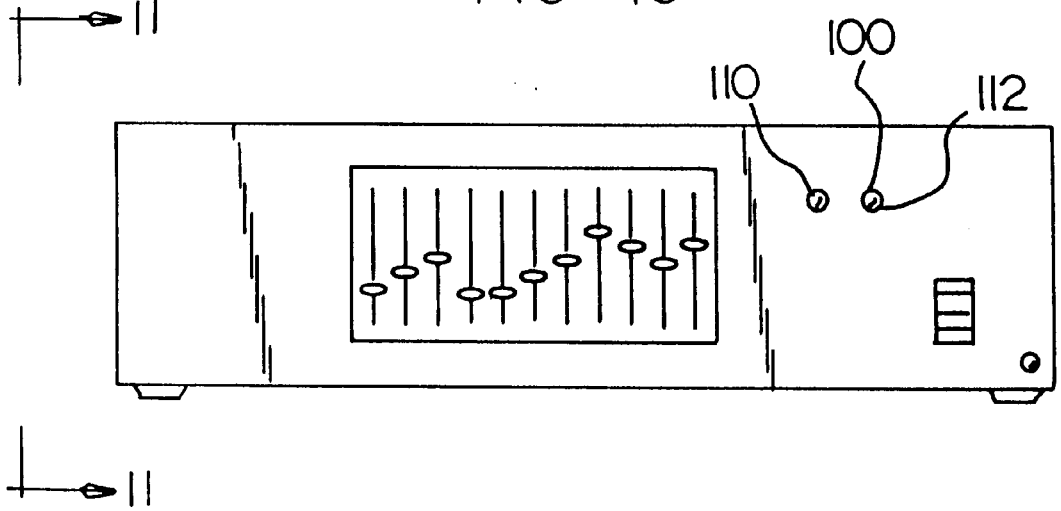
FIG. 10 is a front view of the cabinet of the alternate embodiment of the present invention.
Figure 11:
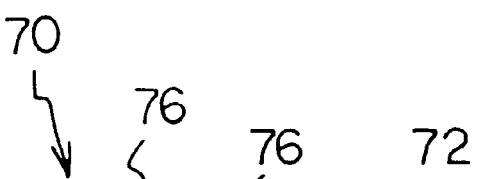
FIG. 11 is a side view of the cabinet of the present invention with the sliding bracket assembly shown in phantom lines.

Further components of the alternate embodiment include a pair of depressible illuminatable buttons 100 situated on the front face of the cabinet, as shown in FIG. 10. The illuminatable buttons include an eject button 110 adapted to transmit an eject signal upon the depression thereof and further illuminate only upon the receipt of a front stop signal. Associated therewith is an insert button 112 adapted to transmit an insert signal upon the depression thereof and further illuminate only upon the receipt of a back stop signal. Also provided are a pair of sensors 114. Such sensors include a back stop sensor 116 coupled to a rear end of the bottom horizontal face of the bracket. This sensor is adapted to transmit a back stop signal upon the bracket of the sliding bracket assembly reaching the second orientation thereof. The sensors further include a front stop sensor 118 situated on the outer surface of the top vertical wall of the bracket. In use, the front stop sensor is adapted to transmit a front stop signal upon the bracket reaching its first orientation. It should be noted that the sensors comprise of spring biased switches. Also shown in the Figures is a solenoidal locking means 120. Such locking means is located adjacent the motor and has a locking shaft 122. Such shaft has a first unbiased orientation extended downwardly through the cutout of the bracket and a second biased orientation extended upwardly. In the first unbiased orientation, the shaft is adapted to be inserted within an aperture in the bottom side of the cabinet when the bracket is in the second orientation thereof. The solenoidal locking means is adapted to shift the shaft to the second orientation thereof upon the receipt of the eject signal. To afford proper utilization of the forgoing components, unillustrated control circuitry is connected between the buttons, sensors, solenoidal locking means and motor. When the eject signal is received, the control circuitry is adapted to transmit the same to the solenoidal locking means to allow movement of the bracket. After a predetermined amount of time it takes to unlock the solenoidal locking means, the control circuitry is adapted effect the actuation of the motor so that the bracket travels toward the first orientation thereof. The control circuitry is further adapted to effect the actuation of the motor such that the bracket travels toward the second orientation thereof upon the receipt of the insert signal. It should be noted that the shaft of the solenoidal locking means is adapted to automatically insert within the associated aperture when the bracket is in the second orientation thereof. When either of the stop signals are received by the control circuitry, the motor is deactivated and the appropriate stop signal is forwarded to the buttons such that the proper button is illuminated. This indicates the current status of the sliding bracket.

The present invention is an interchangeable amplifier device for boosting the power stereo speakers at various selective levels. The invention allows you to increase the output to the speakers when connecting the speaker wire of a mini-radio to the amplifier unit. With the upgradable power board that connects it to the upgradable board connector included in the amplifier, the user gets four speaker output. Also, the upgradable board connector has various sections, and each section allows the output to be increased as you move up the board connector.

While not shown, cooling fans are preferably mounted adjacent the boards when they are inserted within the cabinet. Such fans are adapted to combat conventional heating of the electrical components of the power boards.

Figure 12:
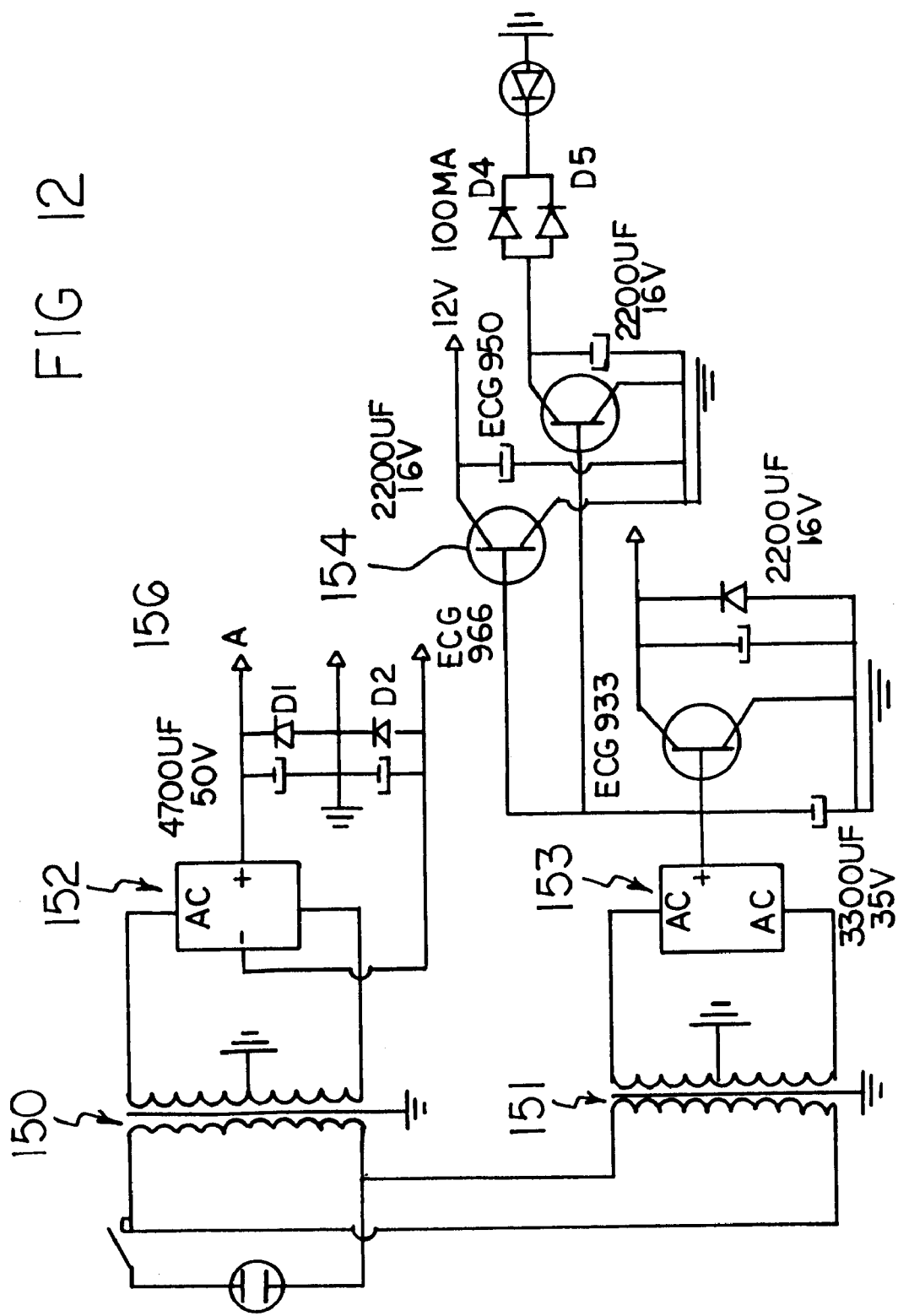
FIG. 12 is a detailed schematic depicting the interconnection of electrical components of both the amplifier and power board.

With reference now to FIG. 12, the specific electrical components of the present invention will now be disclosed. The interconnection of such electrical components is shown in FIG. 12. It can be seen that a power supply is included having a pair of transformers 150 & 151, a pair rectifiers 152 & 153, diodes D1 & D2, three transistors 154, and a plurality of condensers 156. Transformer 150 is employed as a high power output to play the amplifier chips. Transformer 151 is utilized as a lower power output for the processor, power indicator, and the cooling fan. The transformers 150 & 151 are connected to the rectifiers 152 & 153. Transformer 150 and bridge rectifier 152 are together used in a split power supply circuit. Such split power supply circuit is common in conventional home audio power amplifiers. Transformer 151 and rectifier 153 are utilized as a single power supply circuit. It should be noted that all of the condensers are utilized for filters. The diodes constitute protection parts. With regard to the transistors 154, transistor ECG-933 is a twelve volt regulator transistor with a five amp output. Transistor ECG-950 is a twelve volt regulator transistor with a one amp output. Finally, transistor ECG-966 is also a twelve volt regulator transistor, but with a one hundred milli-amp output. Regarding the diodes, it should be understood that diodes D4 & D5 act as regulators for the light emitting diode. Also shown in FIG. 12 is a switch 160 provided for being used as a main power switch. It is imperative to understand that all of the forgoing components are capable of being changed to increase power output.

In operation, transistor ECG-966 is used to regulate power needed for the cooling fan. The power indicator and cooling fan draw less current than the amplifier chips. Nodes labeled A and B are connected to the circuit board. The slots are then connected to the circuit board. The upgradable boards/module are plugged into these slots to receive power for the amplifier chips. On the back of the interchangeable amplifier, there resides a set of RCA jacks. An audio signal from a mini stereo is applied to these jacks. The signal then goes to an audio automatic gain circuit, then goes to the processor. The processor circuit includes a pre-amp, controls, and drive circuitry. Such circuit is conventional and commercially available. The output of the processor is, in turn, connected to the slot with the power supply mentioned earlier. The speaker output terminals are also connected to the slots, one terminal to one slot.

Figure 13:
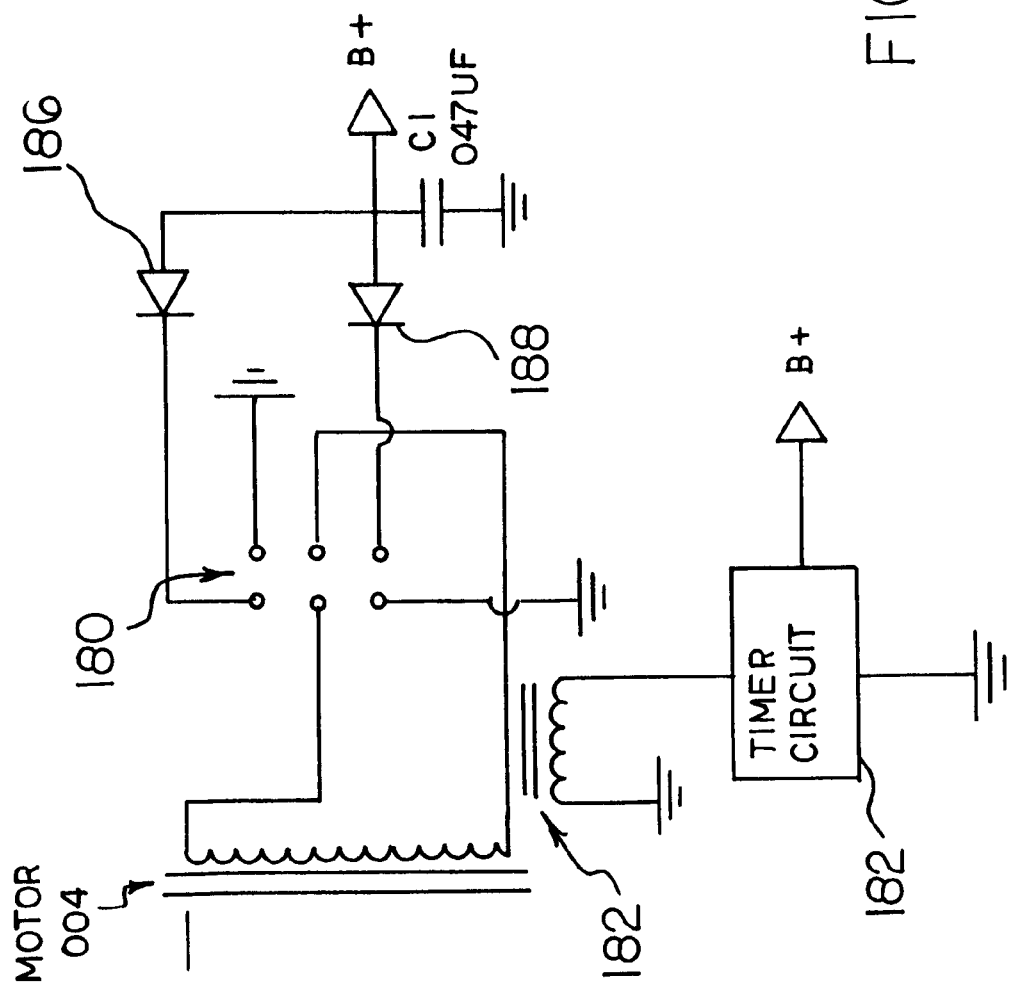
FIG. 13 is a schematic depicting additional circuitry associated with the present invention.

FIG. 13 depicts a part of the motor control circuit that is not conventional. It should be noted that these parts may be changed or supplemented to improve performance. Switch 180 is used as the ejector and insert switch. Relay 182 and timer circuit 184 are used to delay movement of the motor for five seconds. This delay enables the locking circuit to unlock the mechanical part of the unit. The amplifier chips are ECG or NTE part number 1326, 1327, 1328, 1337. Diodes D1 and D2 186 and 188, respectively, are ECG 5850.

In use, the upgradable power board receives a first voltage of input form a power supply, when plugged into the upgradable slots connectors. The board then supplies the amplifier with the regulated power. The amplifiers are internal and need the boards to select and switch them on and off. The upgradable power boards are configured to activate the different amps. There are a set of amplifier chips inside the cabinet. With wattage ranging from 60 Watts per channel to 120 Watts per channel, the upgradable power board supplies the different amp with the right amount of power. The boards also connect the speaker output and audio input. On the upgradable power board there are resistors, condensers, and transistors. The resistors are used to regulate the power needed for the amps, the condensers are used to filter the power supply. By this structure, the present invention is capable of playing different wattages at the same time. For example, 2 60 and 2 120 wattages can be played at the same time.

As to the manner of usage and operation of the e present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A new and improved interchangeable amplifier device for boosting the power to stereo speakers comprising in combination:

a generally rectangular amplifier cabinet having a bottom side, a top side and enclosing side walls for housing the amplifier electronics, the enclosing side walls having a front wall and a back wall, the front wall of the cabinet having a volume control and a power switch, the volume control being comprised of a plurality of sliders each being movable up and down within a slider channel, the sliders being capable of controlling frequencies being projected through stereo speakers;

the back wall of the amplifier cabinet having an audio port and an AC power supply cord, the audio port having a plurality of speaker terminals for receiving the stereo speaker leads, the audio port having a plurality of input jacks below the speaker terminals, the input jacks being capable of receiving audio input for transmission to the stereo speakers;

an upgradable power board being generally rectangular and having at least two flat leads, the two leads capable of being plugged into an upgrade slot connector, the upgrade slot connector having four panels with each panel having a plurality of vertical jack slots, the jack slots of one panel being in symmetrical alignment with the jack slots of the other panels;

a sliding bracket assembly including a pair of guide rails extending between the front wall and the back wall of the cabinet adjacent to the bottom side thereof, an elongated rack positioned between the guide rails in parallel relationship therewith, and a bracket having an L-shaped configuration with a bottom horizontal face and a top vertical face integrally coupled to a side edge of the bottom horizontal face, the bracket slidably coupled to the guide rails along a bottom surface of the bottom horizontal face thereof wherein the upgrade slot connector is coupled to an outer surface of the top vertical wall of the bracket, the sliding bracket assembly having a first orientation with the upgrade slot connector situated adjacent a plurality of openings formed in the cabinet for allowing access thereto and a second orientation with the upgrade slot connector positioned distant the openings adjacent the front wall of the cabinet for storing the upgradable power board entirely within the cabinet, the sliding bracket assembly further including a pinion motor positioned on a top surface of the bottom horizontal face of the bracket with a pinion thereof extending through a cutout formed in the bottom horizontal face for engaging the rack thereby facilitating mechanized sliding of the sliding assembly along the guide rails;

said upgradable power board being capable of receiving a first voltage of input from a transformer when plugged into the upgrade slot connector of the amplifier, the upgradable power board being capable of resupplying the amplifier with a second voltage of a magnitude greater than the magnitude of the first voltage; and an integrated circuit within the upgradable power board being capable of receiving the first voltage for the amplifier from a transistor within the upgradable power board, the integrated circuit being capable of amplifying the first voltage to produce the second voltage for increasing the output from the amplifier to the stereo speaker.

2. An interchangeable amplifier device comprising:

an amplifier cabinet having a bottom side, a top side and enclosing side walls for housing the amplifier electronics, the enclosing side walls having a front wall and a back wall, the front wall of the cabinet having a volume control and a power switch, the back wall of the amplifier cabinet having an audio port and an AC power supply cord, the audio port having a plurality of speaker terminals and a plurality of input jacks being capable of receiving audio input for transmission to the stereo speakers;

an upgradable power board having at least two flat leads capable of being plugged into an upgrade slot connector found along the back wall of the amplifier cabinet, the upgradable power board being capable of receiving a first voltage of input from a transformer when plugged into the upgrade slot connector, the upgradable power board being capable of resupplying the amplifier with a regulated voltage; and a sliding bracket assembly to which the upgrade slot connector is removably coupled, the sliding bracket assembly being positioned within the amplifier cabinet, having a first orientation with the upgrade slot connector situated adjacent a plurality of openings formed in the cabinet for allowing access thereto and a second orientation with the upgrade slot connector positioned distant the openings adjacent the front wall of the cabinet for storing the ungradable power board entirely within the cabinet, a motor for use in moving the sliding bracket assembly between the first and second orientations.

3. The interchangeable amplifier device as set forth in claim 2, wherein the volume control on the front wall being comprised of a plurality of sliders each being movable up and down within a slider channel, the sliders being capable of controlling frequencies being projected through the stereo speakers when coupled to the amplifier.

4. The interchangeable amplifier device as set forth in claim 2, wherein the upgrade slot connector having four panels with each panel having a plurality of vertical jack slots, the jack slots of one panel being in symmetrical alignment with the jack slots of the other panels for receipt of the two leads, and the upgradable board capable of being plugged into combinations of the plurality of jack slots for decreasing and increasing the second voltage to the amplifier.

5. The interchangeable amplifier device as set forth in claim 2, wherein an integrated circuit being included within the upgradable power board and capable of receiving the first voltage for the amplifier from a transistor within the upgradable power board, the integrated circuit being capable of amplifying the first voltage to produce the second voltage for increasing the output from the amplifier to the stereo speaker.

6. The interchangeable amplifier device as set forth in claim 2 and further including control means for allowing manual shifting of the sliding bracket assembly between the first and second orientation thereof.

7. The interchangeable amplifier device as set forth in claim 2 and further including indication means for indicating which orientation the sliding bracket assembly resides.

8. The interchangeable amplifier device as set forth in claim 2 and further including locking means for maintaining the sliding bracket assembly in the second orientation thereof.

* * * * *